(12) United States Patent
Chacko et al.

(10) Patent No.: US 11,972,948 B2
(45) Date of Patent: Apr. 30, 2024

(54) ADHESION LAYERS FOR EUV LITHOGRAPHY

(71) Applicant: Brewer Science, Inc., Rolla, MO (US)

(72) Inventors: Andrea M. Chacko, Rolla, MO (US); Vandana Krishnamurthy, Rolla, MO (US); Yichen Liang, Rolla, MO (US); Hao Lee, Camas, WA (US); Stephen Grannemann, Rolla, MO (US); Douglas J. Guerrero, Tombeek (BE)

(73) Assignee: Brewer Science, Inc., Rolla, MO (US)

( * ) Notice: Subject to any disclaimer, the term of this patent is extended or adjusted under 35 U.S.C. 154(b) by 721 days.

(21) Appl. No.: 16/439,377

(22) Filed: Jun. 12, 2019

(65) Prior Publication Data

US 2019/0385837 A1    Dec. 19, 2019

Related U.S. Application Data

(60) Provisional application No. 62/684,359, filed on Jun. 13, 2018.

(51) Int. Cl.
*G03F 7/00* (2006.01)
*G03F 1/24* (2012.01)
*H01L 21/02* (2006.01)
*H01L 21/027* (2006.01)

(52) U.S. Cl.
CPC ............ *H01L 21/0274* (2013.01); *G03F 1/24* (2013.01); *G03F 7/70033* (2013.01); *H01L 21/02115* (2013.01); *H01L 21/02282* (2013.01); *H01L 21/02304* (2013.01); *H01L 21/02422* (2013.01)

(58) Field of Classification Search
CPC ... G03F 7/09; G03F 7/11; G03F 7/092; G03F 7/094
See application file for complete search history.

(56) References Cited

U.S. PATENT DOCUMENTS

| | | |
|---|---|---|
| 5,919,599 A | 7/1999 | Meador et al. |
| 6,219,472 B1 | 4/2001 | Horino et al. |
| 6,809,127 B2 | 10/2004 | Dones et al. |
| 6,962,769 B2 | 11/2005 | Shao et al. |
| 7,323,289 B2 | 1/2008 | Neef et al. |
| 7,361,444 B1 | 4/2008 | Angelopoulos et al. |
| 7,939,244 B2 | 5/2011 | Xu et al. |
| 8,207,264 B2 | 6/2012 | Belcheva |
| 8,257,910 B1 | 9/2012 | Guerrero et al. |
| 8,895,230 B2 | 11/2014 | Krishnamurthy et al. |
| 8,968,989 B2 | 3/2015 | Ouattara et al. |
| 9,176,377 B2 | 11/2015 | Stowers et al. |
| 9,195,137 B2 | 11/2015 | Endo et al. |
| 9,310,684 B2 | 4/2016 | Meyers et al. |
| 9,372,402 B2 | 6/2016 | Freedman et al. |
| 9,527,971 B2 | 12/2016 | Oner-Deliormanli |
| 9,543,159 B2 | 1/2017 | Chen et al. |
| 9,746,768 B2 | 8/2017 | Ohnishi et al. |
| 9,892,915 B2 | 2/2018 | Yang et al. |
| 9,916,973 B2 | 3/2018 | Hustad et al. |
| 9,929,012 B1 | 3/2018 | Belyansky et al. |
| 9,996,004 B2 | 6/2018 | Smith et al. |
| 10,078,265 B2 | 9/2018 | Aoki et al. |
| 10,228,618 B2 | 3/2019 | Meyers et al. |
| 10,381,481 B1* | 8/2019 | Zi .......................... G03F 7/0043 |
| 10,627,719 B2 | 4/2020 | Waller et al. |
| 10,642,153 B2 | 5/2020 | Meyers et al. |
| 2002/0076495 A1 | 6/2002 | Maloney et al. |
| 2005/0164126 A1 | 7/2005 | Kim et al. |
| 2005/0279995 A1 | 12/2005 | Shin et al. |
| 2006/0293482 A1 | 12/2006 | Rantala et al. |
| 2007/0082288 A1 | 4/2007 | Wright et al. |
| 2008/0124649 A1 | 5/2008 | Angelopoulos et al. |
| 2008/0176167 A1* | 7/2008 | Kawamori ........ H01L 21/76251 430/271.1 |
| 2009/0047517 A1 | 2/2009 | Caruso et al. |
| 2009/0197086 A1 | 8/2009 | Rathi et al. |

(Continued)

FOREIGN PATENT DOCUMENTS

| | | |
|---|---|---|
| CN | 102016724 | 4/2011 |
| CN | 104937493 | 9/2015 |

(Continued)

OTHER PUBLICATIONS

Goldberg et al., "An EUV Fresnel zoneplate mask-imaging microscope for lithography generations reaching 8 nm," Proc. of SPIE, 2011, vol. 7969, 796910-1-796910-12.
Roberts et al., "Sensitivity of EUV resists to out-of-band radiation," Proc. of SPIE, 2009, vol. 7273, 72731W-1-72731W-13.
International Search Report and Written Opinion mailed Oct. 1, 2019 in corresponding PCT/US2019/036791 filed Jun. 12, 2019, 13 pages.
Machine Translation of KR10-2010-0042959, 10 pages.
Machine Translation of KR10-2009-0056433, 7 pages.
Machine Translation of KR10-2009-0117324, 6 pages.
Stowers, J., "Metal Oxide Photoresists: Breaking Paradigms in EUV Lithography," Inpria, 2017 EUVL Workshop, 17 pages.

(Continued)

*Primary Examiner* — Daborah Chacko-Davis
(74) *Attorney, Agent, or Firm* — HOVEY WILLIAMS LLP

(57) ABSTRACT

New lithographic compositions for use as EUV adhesion layers are provided. The present invention provides methods of fabricating microelectronics structures using those compositions as well as structures formed by those methods. The method involves utilizing an adhesion layer immediately below the photoresist layer. The adhesion layer can either be directly applied to the substrate, or it can be applied to any intermediate layer(s) that may be applied to the substrate, such as an alpha-carbon, spin-on carbon, spin-on silicon hardmask, metal hardmask, or deposited silicon layer. The preferred adhesion layers are formed from spin-coatable, polymeric compositions. The inventive method improves adhesion and reduces or eliminates pattern collapse issues.

29 Claims, 5 Drawing Sheets

(56) References Cited

U.S. PATENT DOCUMENTS

| | | |
|---|---|---|
| 2009/0258315 A1 | 10/2009 | Ober et al. |
| 2012/0088192 A1 | 4/2012 | Trefonas et al. |
| 2012/0315451 A1* | 12/2012 | Malik .................. C08F 4/12 |
| | | 428/209 |
| 2013/0075154 A1* | 3/2013 | Saito .................. H01L 23/057 |
| | | 174/536 |
| 2013/0224652 A1 | 8/2013 | Bass et al. |
| 2015/0198877 A1* | 7/2015 | Domon .................. G03F 7/0382 |
| | | 430/285.1 |
| 2015/0234272 A1 | 8/2015 | Sarma et al. |
| 2016/0011505 A1 | 1/2016 | Stowers et al. |
| 2016/0026083 A1* | 1/2016 | Tango .................. G03F 7/2041 |
| | | 430/311 |
| 2016/0085003 A1* | 3/2016 | Jaiswal .................. G03F 7/70958 |
| | | 250/307 |
| 2016/0187777 A1 | 6/2016 | Nakagawa et al. |
| 2016/0218013 A1 | 7/2016 | Ohashi et al. |
| 2016/0259244 A1 | 9/2016 | Yamashita et al. |
| 2017/0088758 A1 | 3/2017 | Bzowej et al. |
| 2017/0309493 A1 | 10/2017 | Ogihara et al. |
| 2018/0120706 A1 | 5/2018 | Shirakawa et al. |
| 2018/0203355 A1* | 7/2018 | De Silva .................. G03F 7/2004 |
| 2018/0233362 A1 | 8/2018 | Glodde et al. |
| 2018/0335698 A1 | 11/2018 | Nakajima et al. |
| 2019/0137870 A1 | 5/2019 | Meyers et al. |
| 2019/0153001 A1 | 5/2019 | Cardineau et al. |
| 2019/0308998 A1 | 10/2019 | Cardineau et al. |
| 2020/0124970 A1 | 4/2020 | Kocsis et al. |

FOREIGN PATENT DOCUMENTS

| | | |
|---|---|---|
| CN | 106019849 | 10/2016 |
| JP | 2000-206680 | 7/2000 |
| JP | 2001-022068 | 1/2001 |
| JP | 2015-108781 | 6/2015 |
| JP | 2017-181639 | 10/2017 |
| JP | 2018-056269 | 4/2018 |
| KR | 10-2009-0056433 | 6/2009 |
| KR | 10-2009-0117324 | 11/2009 |
| KR | 10-2010-0042959 | 4/2010 |
| TW | I603145 | 10/2017 |
| WO | 2009/052352 | 4/2009 |
| WO | 2015/030060 | 3/2015 |

OTHER PUBLICATIONS

Supplemental European Search Report dated Mar. 2, 2022 in corresponding European Patent Application No. 19820156.8, 7 pages.
Machine Translation of JP2018056269, 37 pages.
Wang et al., "Novel polymeric anionic photoacid generators (PAGS) and corresponding polymers for 193 nm lithography," J. Mater. Chem., 16, 3701-3707 (2006), 7 pages.
Xu et al., "Underlayer Designs to Enhance the Performance of EUV Resists," Proc. of SPIE, vol. 7273, 72731J-1-72731J-11 (2009), 11 pages.
Machine Translation of JP2000-206680, 19 pages.
Machine Translation of JP2001-022068, 32 pages.
Office Action dated Mar. 14, 2023 in corresponding Taiwanese Patent Application No. 108120498, 7 pages.
Translation of Office Action dated Mar. 14, 2023 in corresponding Taiwanese Patent Application No. 108120498, 6 pages.
Office Action dated Apr. 25, 2023 in corresponding Japanese Patent Application No. 2020-567988, 3 pages.
Translation of Office Action dated Apr. 25, 2023 in corresponding Japanese Patent Application No. 2020-567988, 5 pages.
Machine Translation of JP2017181639, 36 pages.
Office Action dated Sep. 6, 2023 in corresponding Chinese Patent Application No. 201980039710.6, 14 pages.

* cited by examiner

ADHESION LAYERS FOR EUV LITHOGRAPHY

RELATED APPLICATIONS

The present application claims the priority benefit of U.S. Provisional Patent Application Ser. No. 62/684,359, filed Jun. 13, 2018, entitled ADHESION LAYERS FOR EUV LITHOGRAPHY, incorporated by reference in its entirety herein.

BACKGROUND OF THE INVENTION

Field of the Invention

This invention relates in general to methods of fabricating microelectronic structures using EUV (extreme ultraviolet) lithography.

Description of the Prior Art

As the semiconductor industry continues to follow Moore's law, the demand for ever-decreasing feature sizes requires the use of thinner films to prevent pattern collapse. Thinner films will require using a hardmask to transfer the pattern to the substrate. Extreme ultraviolet (EUV) exposure is expected to be the method of choice for single exposure lithography to achieve the required critical dimension (CD) targets of the 7-nm node and beyond. Unfortunately, EUV lithography has been hindered by a number of problems, including a lack of powerful radiation sources, stochastic effects, and adhesion issues.

Traditional trilayer stacks, containing a carbon-containing layer, a silicon-containing layer, and a photoresist, often suffer from poor adhesion between the photoresist and the silicon underlayer. This poor adhesion often leads to significant collapse in the patterned resist, especially at lower critical dimensions (CDs).

One approach has been to implement spin-on-silicon hardmasks that offer better adhesion to the photoresist due to their relatively high carbon content. One significant compromise to the improved adhesion is a major decrease in $CF_4$ etch rate as a result of the lower silicon content in the silicon hardmask (Si-HM) layer.

SUMMARY OF THE INVENTION

The invention broadly provides a method of forming a structure, where the method comprises providing a substrate optionally including one or more intermediate layers thereon. An adhesion layer is formed on the substrate, or on the one or more intermediate layers, if present. The adhesion layer has an average thickness that is greater than a monolayer but less than 9 nm and a metal content of less than about 0.001% by weight, based upon the total weight of the adhesion layer taken as 100% by weight. A photoresist layer is formed on the adhesion layer and at least a portion of the photoresist layer is subjected to EUV radiation.

In another embodiment, the invention provides a method of forming a structure, where the method comprises providing a substrate optionally including one or more intermediate layers thereon. An adhesion layer is formed on the substrate, or on the one or more intermediate layers, if present. The adhesion layer is non-conductive and has an average thickness that is greater than a monolayer but less than 9 nm. A photoresist layer is formed on said adhesion layer and at least a portion of the photoresist layer is subjected to EUV radiation.

DETAILED DESCRIPTION OF THE PREFERRED EMBODIMENTS

Inventive Method

Figure 1:
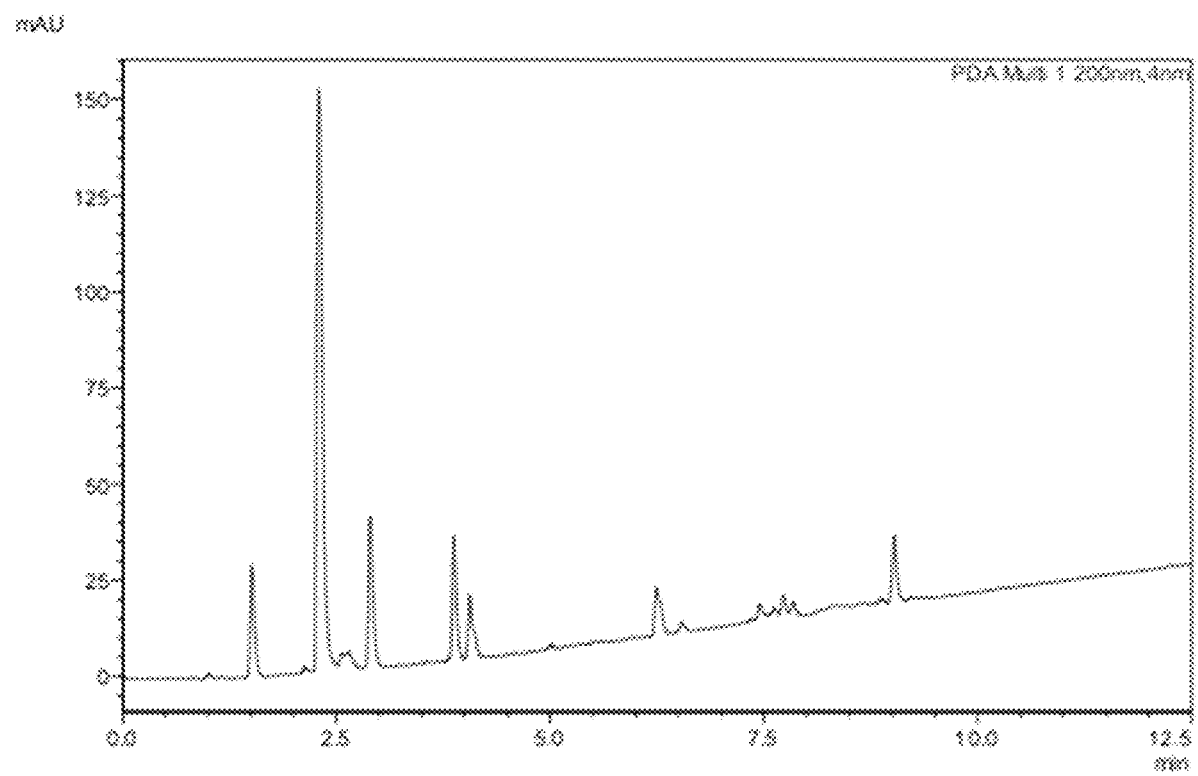
FIG. 1 is a graph showing the HPLC characterization of Mother Liquor 2 of Example 2.

In more detail, the present invention provides a method of forming a microelectronic structure that is particularly suited for EUV (i.e., 13.5 nm) lithography. In the inventive method, a substrate having a surface is provided. Any microelectronic substrate can be utilized. The substrate is preferably a semiconductor substrate, such as silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing. Optional intermediate layers may be formed on the substrate prior to processing. The substrate can have a planar surface, or it can include topographic features (via holes, trenches, contact holes, raised features, lines, etc.). As used herein, "topography" refers to the height or depth of a structure in or on a substrate surface.

A carbon-rich layer may be formed on the substrate or any intermediate layers. The carbon-rich layer can be formed by any known application method, with one preferred method being spin-coating at speeds from about 1,000 to about 5,000 rpm, preferably from about 1,250 to about 1,750 rpm, for a time period of from about 30 to about 120 seconds, preferably from about 45 to 75 seconds. The term "carbon-rich" refers to layers formed from compositions comprising greater than about 50% by weight carbon, preferably greater than about 70% by weight carbon, and more preferably from about 75 to about 80% by weight carbon, based upon the total solids in the composition taken as 100% by weight. Suitable carbon-rich layers are selected from the group consisting of spin-on carbon layers (SOC), amorphous carbon layers, and carbon planarizing layers.

Exemplary carbon-rich layers will generally compromise a polymer dissolved or dispersed in a solvent system, along with the following optional ingredients: acid and/or base quenchers, catalysts, crosslinking agents, and surface modification additives. Preferred compositions will be suitable for forming thick layers and preferably have solids content of from about 0.1% to about 70%, more preferably from about 1% to about 5%, and even more preferably from about 1% to about 3% by weight, based upon the total weight of the composition taken as 100% by weight. After the carbon-rich composition is applied, it is preferably heated to a temperature from about 100° C. to about 400° C., and more preferably from about 160° C. to about 350° C. and for a time period of from about 30 seconds to about 120 seconds, preferably from about 45 seconds to about 60 seconds, to evaporate solvents. The thickness of the carbon-rich layer after baking is preferably from about 10 nm to about 120 nm, more preferably from about 20 nm to about 100 nm, and even more preferably from about 40 nm to about 60 nm. The carbon-rich layer may be formed by other known application methods, such as chemical vapor deposition (CVD), plasma-enhanced chemical vapor deposition (PECVD), atomic layer deposition (ALD), or plasma-enhanced atomic layer deposition (PEALD).

A hardmask layer may be applied adjacent to the carbon-rich material, to the substrate, or any intermediate layers. The hardmask layer can be formed by any known application method, such as chemical vapor deposition (CVD) or plasma-enhanced chemical vapor deposition (PECVD). Another preferred method is spin-coating at speeds from about 1,000 to about 5,000 rpm, preferably from about 1,250 to about 1,750 rpm, for a time period of from about 30 to about 120 seconds, preferably from about 45 to about 75 seconds. Suitable hardmask layers are preferably high-silicon-content materials selected from the group consisting of silanes, siloxanes, silsesquioxanes, silicon oxynitride, silicon nitride, polysilicon, amorphous silicon, or any layer with a high etch bias relative to the underlying layers. Exemplary hardmask layers will generally compromise a polymer dissolved or dispersed in a solvent system, along with the following optional ingredients: surfactants, acid or base catalysts, and crosslinkers. Preferred compositions will preferably have solids content of from about 0.1% to about 70%, more preferably from about 0.5% to about 10%, and even more preferably from about 0.5% to about 1% by weight, based upon the total weight of the composition taken as 100% by weight. After the hardmask is applied, it is preferably heated to a temperature from about 100° C. to about 300° C., and more preferably from about 150° C. to about 250° C. and for a time period of from about 30 seconds to about 120 seconds, preferably from about 45 seconds to about 60 seconds, to evaporate solvents. The thickness of the hardmask layer after baking is preferably from about 5 nm to about 50,000 nm, more preferably from about 5 nm to about 1,000 nm, and even more preferably from about 10 nm to about 30 nm. The hardmask layer should have an etch rate at least 0.75 times that of the photoresist in a fluorine-rich plasma atmosphere and at least 5 times slower than the carbon-rich layer in an oxygen-rich plasma etch atmosphere.

Some commercial hardmask layers can be used. Other preferred hardmask layers contain a copolymer of monomers selected from the group containing phenethyltrimethoxysilane (PETMS), 2-(carbomethoxy)ethyltrimethoxysilane (CMETMS), tetraethoxysilane (TEOS), methyltrimethoxysilane, phenyltrimethoxysilane, methyltrimethoxysilane (MTMS), ethyltrimethoxysilane (ETMS), (3-glycidyoxypropyl)triethoxysilane, and 2-(3,4-epoxycyclohexyl)ethyltrimethyoxysilane (ECHTMS).

A composition useful for forming an adhesion layer according to the invention is then applied to the substrate, the carbon-rich layer, the hardmask, or other intermediate layer to form a layer below the photoresist. Preferably, the adhesion layer is applied directly to the hardmask. The composition can be applied by any known application method, with one preferred method being spin coating the composition at speeds preferably from about 1,000 to about 5,000 rpm, more preferably from about 1,250 to about 1,750 rpm, for a time period of preferably from about 30 to about 120 seconds, more preferably from about 45 to about 75 seconds. The adhesion layer is then baked to induce thermal crosslinking of the composition to form a cured layer. Preferred baking conditions preferably involve temperatures from about 100° C. to about 300° C., and more preferably from about 150° C. to about 250° C., for a time period of from about 30 seconds to about 120 seconds, preferably from about 45 seconds to about 60 seconds.

The average thickness of the adhesion layer after baking is greater than a monolayer (i.e., greater than a single layer of molecules or atoms) but less than 9 nm, preferably from about 1 nm to 9 nm, more preferably from about 2 nm to about 6 nm, and even more preferably from about 4 nm to about 5 nm. If the substrate surface includes topography, the adhesion layer is preferably applied at a thickness sufficient to substantially cover the substrate topography.

The inventive adhesion layers will have low metal contents. In a preferred embodiment, the metal content is less than about 0.005% by weight, preferably less than about 0.001% by weight, and more preferably about 0% by weight, based upon the total weight of the adhesion layer taken as 100% by weight. It is further preferred that the adhesion layers are non-conducting layers.

It will be appreciated that the desired contact angle of the inventive adhesion layer will depend on the application. The water contact angle of the adhesion layer after baking is preferably from about 50° to about 95°. For negative-tone develop applications, the contact angle of the adhesion layer after baking is preferably from about 55° to about 70°, when measured using water. Positive-tone develop applications may require a higher water contact angle, such as from about 70° to about 90°. The water contact angle can be measured with any conventional equipment for doing so, with a VCA-3000S Wafer System (AST Products, Billerica, MA) being one example of suitable equipment for this measurement.

The cured adhesion layer will be substantially insoluble in typical organic solvents such as ethyl lactate (EL), propylene glycol methyl ether acetate (PGMEA), propylene glycol methyl ether (PGME), propylene glycol n-propyl ether (PnP), cyclohexanone, acetone, gamma butyrolactone (GBL), and mixtures thereof. Thus, when subjected to a stripping test, the cured adhesion layers will have a percent stripping of less than about 5%, preferably less than about 1%, and more preferably about 0%. The stripping test involves first determining the thickness (by taking the average of measurements at five different locations) of the cured layer. This average is the initial average film thickness. Next, a solvent (e.g., ethyl lactate) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This average is the final average film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

After the adhesion layer is cured, an EUV photoresist (i.e., imaging layer) can be applied to the adhesion layer to form a photoresist layer. Any commercial EUV photoresist can be utilized. In one embodiment, the photoresist is a chemically amplified resist (CAR). In another embodiment, the photoresist is a non-chemically amplified resist. In one embodiment, the non-chemically amplified resist selected includes a metal, such as those selected from the group consisting of titanium, zinc, tin, hafnium, zirconium, indium, vanadium, cobalt, molybdenum, tungsten, aluminum, gallium, silicon, germanium, phosphorous, arsenic, yttrium, lanthanum, cerium, lutetium, and mixtures of the foregoing. In another embodiment, the metal is provided as part of a metal oxide or organometallic compound in the photoresist composition. Examples of suitable EUV photoresists are available from suppliers including, JSR, TOK, Sumitomo, Shin Etsu, Fuji-Film, Inpria, Irresistible Materials, and Zeon. In a particularly preferred embodiment, a metal-containing photoresist such as those described above is used in combination with the inventive adhesion layer and a spin-on carbon layer as an intermediate layer.

In another embodiment, the photoresist selected does not comprise metal (i.e., is essentially free, or preferably completely free, of metal). More particularly, the photoresist composition utilized and final photoresist layer formed each comprise less than about 0.5% by weight metal, preferably less than about 0.1% by weight metal, and more preferably about 0% by weight metal, based upon the total weight of the photoresist composition or layer being taken as 100% by weight.

Regardless of the photoresist type, the photoresist layer can be formed by any conventional method, with one preferred method being spin coating the photoresist composition at speeds of from about 350 rpm to about 4,000 rpm (preferably from about 1,000 rpm to about 2,500 rpm) for a time period of from about 10 seconds to about 60 seconds (preferably from about 10 seconds to about 30 seconds). The photoresist layer is then optionally post-application baked ("PAB") at a temperature of at least about 45° C., preferably from about 80° C. to about 250° C., and more preferably from about 100° C. to about 150° C., and for time periods of from about 20 seconds to about 30 minutes, more preferably from about 30 seconds to about 20 minutes. The thickness of the photoresist layer after baking will typically be from about 5 nm to about 200 nm, preferably from about 10 nm to about 50 nm, and more preferably from about 20 nm to about 40 nm.

The photoresist layer is subsequently patterned by exposure to EUV radiation for a dose of from about 5 $mJ/cm^2$ to about 100 $mJ/cm^2$, preferably from about 10 $mJ/cm^2$ to about 80 $mJ/cm^2$, and more preferably from about 20 $mJ/cm^2$ to about 60 $mJ/cm^2$. More specifically, the photoresist layer is exposed using a mask positioned above the surface of the photoresist layer. The mask has areas designed to permit the EUV radiation to reflect from the mask and contact the surface of the photoresist layer. The remaining portions of the mask are designed to absorb the light to prevent the radiation from contacting the surface of the photoresist layer in certain areas. Those skilled in the art will readily understand that the arrangement of reflecting and absorbing portions is designed based upon the desired pattern to be formed in the photoresist layer and ultimately in the substrate or any intermediate layers.

After EUV exposure, the photoresist layer is subjected to a post-exposure bake ("PEB") at a temperature of at least about 45° C., preferably from about 80° C. to about 250° C., and more preferably from about 100° C. to about 150° C., and for time periods of from about 20 seconds to about 30 minutes, more preferably from about 30 seconds to about 20 minutes.

The photoresist layer is then contacted with a developer to form the pattern. Depending upon whether the photoresist used is positive-working or negative-working, the developer will either remove the exposed portions of the photoresist layer or remove the unexposed portions of the photoresist layer to form the pattern. The pattern is then transferred to the adhesion layer, any present intermediate layers (e.g., hardmask layer, spin-on carbon layer, Si-containing hardmask plus spin-on carbon layer combination, etc.), and finally the substrate. This pattern transfer can take place via plasma etching (e.g., $CF_4$ etchant, $O_2$ etchant) or a wet etching or developing process. In embodiments where the pattern will be transferred from the photoresist layer to the substrate via etching, it is preferred that the etch rate of the adhesion layer relative to a typical EUV photoresist (e.g., organic, metal oxide, or organometallic photoresist) is at least about 1×, and preferably from about 1.5× to about 2×.

In one embodiment, the adhesion layer utilized can be developer soluble. "Developer-soluble" or "wet-developable" as used herein means the portions of the adhesion layer that have been exposed to EUV radiation can be substantially removed with conventional aqueous developers such as tetramethyl ammonium hydroxide (TMAH) developers. The exposed portions of the adhesion layer underneath the exposed portions of the photoresist layer are removed by the developer as the photoresist layer is removed to form the desired pattern in the photoresist layer and the layer(s) under the photoresist. The pattern can be via holes, trenches, lines, spaces, pillars, etc., that will ultimately be transferred to the substrate using an etching or ion implantation process. Preferably, at least about 95% of the exposed portions of the adhesion layer will be removed by the developer, more preferably at least about 99%, and even more preferably about 100% will be removed. Suitable developers are organic or inorganic alkaline solutions such as, but not limited to, TMAH, and preferably comprise an aqueous solution of TMAH at a concentration of 0.26N or lower. Preferably, the dissolution rate of the adhesion layer in 0.26N TMAH developer will be from about 100 nm/s to about 1,000 nm/s, and even more preferably from 500 nm/s to about 1,000 nm/s. Conventional etching, metallization, etc., can then be carried out on the patterned stack to complete the device manufacture.

Regardless of whether pattern transfer is effected by etching or by developing, the resulting features have high resolutions. For example, resolutions of less than about 40 nm half pitch, and preferably less than 30 nm half pitch, can be achieved with the inventive method. Advantageously, the inventive adhesion layers will also improve collapse margin of the final features. Collapse margin is the dose range from the dose to size and the dose at which structures are still standing.

Inventive Compositions

The inventive compositions comprise a polymer or small molecule and an optional crosslinker dispersed or dissolved in a solvent system. The inventive compositions may also contain optional ingredients, such as those selected from the group consisting of surfactants, acids, acid catalysts, bases, base catalysts, polymers, catalysts, additives, and mixtures thereof. It will be appreciated that the composition of the adhesion layer should be selected to be compatible with the photoresist being used.

Suitable polymers and/or small molecules include polymers and small molecules of acrylates, methacrylates, acrylic acids, styrenes, vinyls, epoxies, novolacs, silanes, cyanurates, molecular glass, and mixtures thereof. Particularly preferred polymers comprise monomers selected from the group comprising vinylic monomers, acrylic monomers, and styrenic monomers. The vinylic monomer is preferably selected from the group consisting of glycidyl acrylate, glycidyl methacrylate, and combinations thereof. When a crosslinker is used, the acrylic monomer is preferably an aminoplast-reactive monomer, selected from the group consisting of 2-hydroxy-3-phenoxypropyl acrylate (HPPA), hydroxy propyl methacrylate (HPM), 2-hydroxyethyl methacrylate (HEMA), 2-hydroxyethyl acrylate (HEA), tert-butyl methacrylate, and mixtures thereof. One especially preferred polymer is a copolymer of glycidyl methacrylate and hydroxypropyl methacrylate:

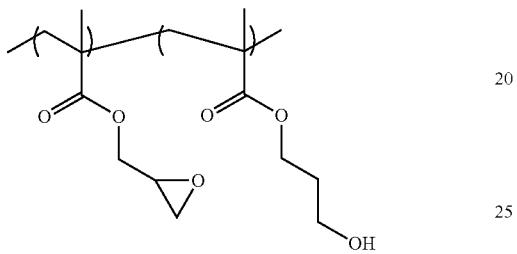

In this embodiment, the glycidyl methacrylate should comprise at least about 30 mole percent of the monomer units and, more preferably, 40 mole percent of the monomer units. The number average molecular weight (Mn) of the polymer is preferably from about 2,000 to about 30,000 g/mol, more preferably from about 10,000 to about 25,000 g/mol. The weight-average molecular weight (Mw) range of the polymer is preferably from about is 5,000-100,000 g/mol, more preferably from about 30,000 to about 70,000 g/mol. The polymer is preferably present in the composition at a level of from about 50% to about 90% by weight, and preferably from about 60% to about 80% by weight, based upon the total weight of the solids in the composition taken as 100% by weight.

When a small molecule is used, one especially preferred small molecule is tris(2,3-epoxypropyl)isocyanurate (TEPIC-S, available from Nissan Chemical America Corporation). The small molecule is preferably present in the composition at a level of from about 40% to about 90% by weight, and preferably from about 60% to about 80% by weight, based upon the total weight of the solids in the composition taken as 100% by weight.

In one embodiment, polymer or small molecule comprising vinylic monomers is grafted with functionalized carboxylic acid moieties. Suitable moieties include, but are not limited to, chromophores such as 9-anthracene carboxylic acid; alkyl (preferably $C_1$-$C_8$, and more preferably $C_1$-$C_4$) carboxylic acids such as acetic acid and butyric acid; aromatic carboxylic acids such as benzoic acid, 4-cyanobenzoic acid, and 4-hydroxybenzoic acid; ethers such as glycolic acid ether; and mixtures thereof. The polymer is functionalized by reacting the polymer with the functionalized carboxylic acid in a solvent in the presence of a catalyst. Suitable reaction catalysts include, but are not limited to, benzyltriethylammonium chloride (BTEAC), and tetrabutyl phosphonium bromide. During the reaction, the carboxylic acid functionality grafts with the epoxy groups of the polymer. Preferably, the polymer active sites are from about 20% to about 100% grafted, and more preferably from about 40% to about 100% grafted. Examples of grafted polymers are shown below, with monomeric ratios being exemplary.

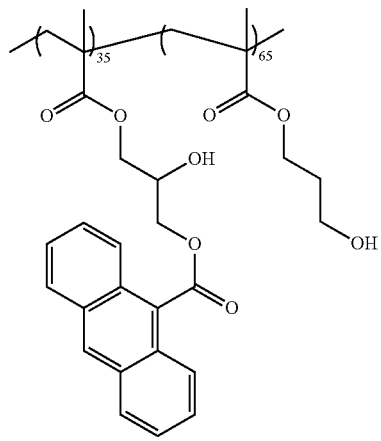

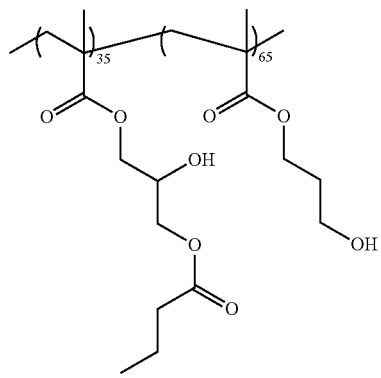

In another embodiment, the polymer or small molecule is physically mixed with functionalized carboxylic acid moieties. Suitable moieties include, but are not limited to, chromophores such as 9-anthracene carboxylic acid; alkyl (preferably $C_1$-$C_8$, and more preferably $C_1$-$C_4$) carboxylic acids such as acetic acid and butyric acid; aromatic carboxylic acids such as benzoic acid, 4-cyanobenzoic acid, and 4-hydroxybenzoic acid; ethers such as glycolic acid ether; and mixtures thereof.

Preferred crosslinkers are selected from the group consisting of vinyl ether crosslinkers, aminoplasts, epoxies, and mixtures thereof. Examples of commercially available vinyl ethers include those sold under the trade name VECTomer™ (Aldrich; St. Louis, MO). Examples of commercially available aminoplasts include those sold under the name Powderlink®, Cymel® 303, and Cymel® 1170. Cymel® 1170 has the structure:

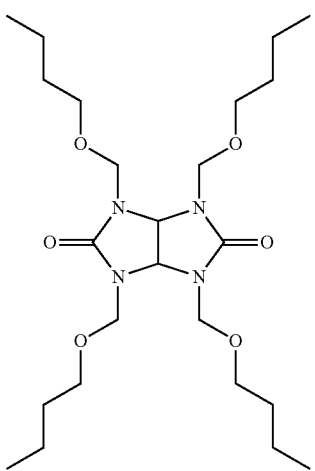 [SMILES: CCCCOCN1C(=O)N(COCCCC)C2C1N(COCCCC)C(=O)N2COCCCC]

Examples of suitable epoxies include those available under the name Araldite® (e.g., MY720 tetra functional epoxy resin) from Huntsman Advanced Materials.

When utilized, the crosslinker is preferably present in the composition at a level of from about 10% to about 50% by weight, and preferably from about 25% to about 45% by weight, based upon the total weight of the solids in the composition taken as 100% by weight.

In some embodiments, a catalyst is utilized. Preferably, the catalyst is simply mixed into the adhesion layer composition. Preferred catalysts include, but are not limited to, those selected from the group consisting of: 5-sulfosalycilic acid, quaternary ammonium blocked triflic acid (such as that sold under the name K-Pure TAG2689), sulfonic acids (e.g., p-toluenesulfonic acid, styrene sulfonic acid), sulfonates (e.g., pyridinium p-toluenesulfonate, pyridinium trifluoromethanesulfonate, pyridinium 3-nitrobenzensulfonate), and combinations thereof. The catalyst should be present in the compositions at a level of from about 0.01% to about 0.05% by weight, and preferably from about 0.01% to about 0.02% by weight, based upon the total weight of the solids in the composition taken as 100% by weight.

In some embodiments, a PAG is utilized. Preferably, the PAG is not attached to the polymer or small molecule, but instead is simply mixed into the adhesion layer composition. Preferred PAGs include, but are not limited to, those selected from the group consisting of: onium salts (e.g., triphenyl sulfonium perfluorosulfonates such as TPS nonaflate, TPS triflate, and substituted forms thereof, such as tris(4-tert-butylphenyl)sulfonium perfluoro-1-butanesulfonate (an alkyl-substituted TPS nonaflate), all available from Sigma-Aldrich); oxime-sulfonates (e.g., those sold under the name CGI® by CIBA); triazines (e.g., TAZ-108® available from Midori Kagaku Company); and combinations thereof. The PAG should be present in the compositions at a level of from about 0.001% to about 0.030% by weight, and preferably from about 0.005% to about 0.015% by weight, based upon the total weight of the solids in the composition taken as 100% by weight.

In another embodiment, the adhesion layer composition is substantially free of any acid generator such as a PAG. That is, the adhesion layer composition will comprise less than about 0.001% by weight PAG, and preferably about 0% by weight PAG, based upon the total weight of the solids in the composition taken as 100% by weight.

In some embodiments, an additive is utilized. Preferably, the additive is simply mixed into the adhesion layer composition. Preferred additives include, but are not limited to, those selected from the group consisting of 1,1,1-tris(4-hydroxyphenyl)ethane (THPE), surfactants, and combinations thereof. The additive should be present in the compositions at a level of from about 0% to about 0.1% by weight, and preferably from about 0.01% to about 0.05% by weight, based upon the total weight of the solids in the composition taken as 100% by weight.

In a preferred embodiment, the adhesion layer composition is essentially metal-free. That is, the metal content of the composition is less than about 0.005% by weight, preferably less than about 0.001% by weight, and more preferably about 0% by weight, based upon the total weight of the solids in the composition taken as 100% by weight.

In another preferred embodiment, the adhesion layer composition is essentially silicon-free. That is, the silicon content of the composition is less than about 1% by weight, preferably less than about 0.5% by weight, more preferably less than about 0.1% by weight, and even more preferably about 0% by weight, based upon the total weight of the solids in the composition taken as 100% by weight.

Preferred solvent systems include a solvent selected from the group consisting of PGMEA, PGME, PnP, EL, cyclohexanone, GBL, methyl isobutyl carbinol, PGEE, and mixtures thereof. Preferably, the solvent system has a boiling point of from about 70° C. to about 200° C., and more preferably from about 100° C. to about 150° C. The solvent system is preferably utilized at a level of from about 98% to about 99.99% by weight, more preferably from about 99% to 99.9%, and even more preferably from about 99.3% to about 99.8% by weight, based upon the total weight of the composition taken as 100% by weight. The compositions used to form the adhesion layers will preferably comprise a solids content of from about 0.1% to about 1% by weight solids, more preferably from about 0.1% to about 0.8% by weight solids, and even more preferably from about 0.1% to about 0.5% by weight solids, based upon the total weight of the composition taken as 100% by weight.

Mixing the above ingredients together in the solvent system forms the adhesion layer composition. Furthermore, any optional ingredients (e.g., surfactants) are also dispersed in the solvent system at the same time.

Other compositions that can be used as the adhesion layer in the present inventive method are described in U.S. Pat. Nos. 8,257,910 and 8,895,230, each of which is incorporated by reference herein.

EXAMPLES

Example 1

Synthesis and Formulation of Acetic-Acid-Grafted Polymer

In this Example, 1.9 grams of glacial acetic acid (Spectrum Chemical Mfg. Corp., Gardena, CA) and 15 grams of a glycidyl methacrylate and hydroxypropyl methacrylate (GMA-HPMA) copolymer (20% in PGME, Osaka, Japan) were weighed into a round bottomed flask and stirring was started. While stirring, 0.18 gram of benzyltriethylammonium chloride (BTEAC) was added. Next, 2.8 grams of PGME (KMG Electronic Chemicals, Fort Worth, TX) were added and used to rinse sides. The round bottomed flask was fitted with a condenser and $N_2$ inlet. The reaction was heated to 110° C. for 16 hours to produce Mother Liquor 1.

Mother Liquor 1 (0.532 gram), 0.3 gram of Cymel® 1170, 0.02 gram of 5-sulfosalycilic acid (5-SSA, King Industries Specialty Chemicals, Norwalk, CT), 0.03 gram of 1,1,1-tris (4-hydroxyphenyl)ethane (THPE, Hereaus, Vandalia, OH), and 0.009 gram of TPS-C1 were dissolved in 74.73 grams of PGME (KMG Electronic Chemicals, Fort Worth, TX) and 174.37 grams of PGMEA (KMG Electronic Chemicals, Fort Worth, TX) and mixed for several hours on a mixing wheel.

Example 2

Synthesis and Formulation of Butyric-Acid-Grafted Polymer

In this procedure, 2.79 grams of butyric acid (Sigma Aldrich, St. Louis, MO) and 15 grams of GMA-HPMA copolymer (20% in PGME) were weighed into a round bottomed flask and stirring was started. While stirring, 0.18 gram of BTEAC was added. 5.34 grams of PGME were added and used to rinse sides. The round bottomed flask was fitted with a condenser and $N_2$ inlet. The reaction was heated to 110° C. for 16 hours to produce Mother Liquor 2.

Next, 0.549 gram of Mother Liquor 2, 0.3 gram of Cymel® 1170, 0.02 gram of 5-SSA, 0.03 gram of THPE, and 0.009 gram of TPS-C1 were dissolved in 74.72 grams of PGME and 174.37 grams of PGMEA and mixed for several hours on a mixing wheel.

Example 3

Synthesis and Formulation of 2-(2-Methoxyethoxy)Acetic-Acid-Grafted Polymer

In this Example, 2.79 grams of 2-(2-methoxyethoxy) acetic acid (Sigma Aldrich, St. Louis, MO) and 15 grams of GMA-HPMA copolymer (20% in PGME) were weighed into a round bottomed flask and stirring was started. While stirring, 0.18 gram of BTEAC was added, after which 9.49 grams of PGME were added and used to rinse sides. The round bottomed flask was fitted with a condenser and $N_2$ inlet. The reaction was heated to 110° C. for 16 hours to produce Mother Liquor 3.

Next, 0.534 gram of Mother Liquor 3, 0.3 gram of Cymel® 1170, 0.02 gram of 5-SSA, 0.03 gram of THPE, and 0.009 gram of TPS-C1 were dissolved in 74.73 grams of PGME and 174.37 grams of PGMEA and mixed for several hours on a mixing wheel.

Example 4

Synthesis and Formulation of 2-[2-(2-Methoxyethoxy)Ethoxy] Acetic-Acid-Grafted Polymer In this procedure, 5.65 grams of 2-(2-methoxyethoxy) acetic acid (Sigma Aldrich, St. Louis, MO) and 15 grams of GMA-HPMA copolymer (20% in PGME) were weighed into a round bottomed flask and stirring was started. While stirring, 0.18 gram of BTEAC was added after which 13.48 grams of PGME were added and used to rinse sides. The round bottomed flask was fitted with a condenser and $N_2$ inlet. The reaction was heated to 110° C. for 16 hours to produce Mother Liquor 4.

Next, 0.59 gram of Mother Liquor 4, 0.3 gram of Cymel® 1170, 0.02 gram of 5-SSA, 0.03 gram of THPE, and 0.01 gram of TPS-C1 were dissolved in 74.7 grams of PGME and 174.3 grams of PGMEA and mixed for several hours on a mixing wheel.

Example 5

Synthesis and Formulation of 9-Anthracene Carboxylic-Acid-Grafted Polymer

In this Example, 3.28 grams of 9-anthracene carboxylic acid (PCAS Canada, Quebec) and 34.26 grams of GMA-HPMA copolymer (20% in PGME) were weighed into a round bottomed flask and stirring was started. While stirring, 0.08 gram of BTEAC was added after which 2.33 grams of PGME were added and used to rinse sides. The round bottomed flask was fitted with a condenser and $N_2$ inlet. The reaction was heated to 116° C. for 24 hours to produce Mother Liquor 5.

Next, 0.30 gram of Mother Liquor 5, 0.18 gram of Cymel® 1170, 0.003 gram of 5-SSA, 0.02 gram of THPE, and 0.01 gram of TPS-C1 were dissolved in 74.85 grams of PGME and 174.65 grams of PGMEA and mixed for several hours on a mixing wheel.

Example 6

Synthesis and Formulation of Styrene-Glycidylmethacrylate Polymer

In this Example, 20.46 grams of a glycidyl methacrylate (Sigma Aldrich, St. Louis, MO), 60 grams of styrene (Sigma Aldrich, St. Louis, MO), and 0.234 grams of AIBN (Charkit, Norwalk, CT) were weighed into a round bottomed flask and purged with nitrogen. The reaction was heated to 80° C. for 2 hours. The reaction was quenched by precipitating into methanol, and the solid was collected to produce Mother Liquor 6.

Next, 4.09 grams of Mother Liquor 6 and 0.007 gram of TAG2689 (King Industries, Norwalk, CT) were dissolved in 14.96 grams of PGME (KMG Electronic Chemicals, Fort Worth, TX) and 130.95 grams of PGMEA (KMG Electronic Chemicals, Fort Worth, TX) and mixed for several hours on a mixing wheel.

Example 7

Synthesis and Formulation of Macromolecule

In this procedure, 17.288 grams of tris(2,3-epoxypropyl) isocyanurate (TEPIC-S, Nissan Chemical Corp., Tokyo, Japan), 0.242 gram of tetrobutylphosphonium bromide (Nippon Chemical Industrial Co. Ltd., Tokyo, Japan), 5.176 grams of 4-cyano benzoic acid (Sankyo Kasei Co. LTD., Osaka, Japan), and 15.544 grams of 4-hydroxybenzoic acid (Sankyo Kasei Co. LTD., Osaka, Japan) were weighed into a round bottomed flask and dissolved in 46.65 grams of PGME (KMG Electronic Chemicals, Fort Worth, TX). The reaction was heated with stirring to 116° C. for 18 hours to produce Mother Liquor 7.

Next, 0.196 gram of Mother Liquor 7, 0.098 gram of Cymel® 1170 (Heraeus, Vandalia, OH), and 0.006 gram of pyridinium para-toluene sulfonate (Millipore Sigma, Darmstadt, Germany) were dissolved in 19.94 grams of PGME (KMG Electronic Chemicals, Fort Worth, TX) and 79.760 grams of PGMEA (KMG Electronic Chemicals, Fort Worth, TX) and mixed for several hours on a mixing wheel.

Example 8

Synthesis and Formulation of Ester Polymer

In this Example, 10.28 grams of MA-DGIC (Shikoku, Tokushima, Japan), 5.106 grams of fumaric acid (Tate and Lyle, Bedford Park, IL), 0.200 gram of hydroquinone (Sigma Aldrich, St. Louis, MO), and 0.414 gram of benzyltriethylammonium chloride (Alfa Aesar) were weighed into a round bottomed flask and dissolved in 64.00 grams of PGME (KMG Electronic Chemicals, Fort Worth, TX). The reaction was heated to 110° C. for 8 hours to produce Mother Liquor 8.

Next, 0.1395 gram of Mother Liquor 8, 0.0349 gram of Powderlink® (Heraeus, Vandalia, OH), and 0.0007 gram of 5-sulfosalycilic acid (5-SSA, King Industries Specialty Chemicals, Norwalk, CT), were dissolved in 69.877 grams of PGME (KMG Electronic Chemicals, Fort Worth, TX) and 29.947 grams of PGMEA (KMG Electronic Chemicals, Fort Worth, TX) and mixed for several hours on a mixing wheel.

Example 9

Material Characterization

Figure 2:
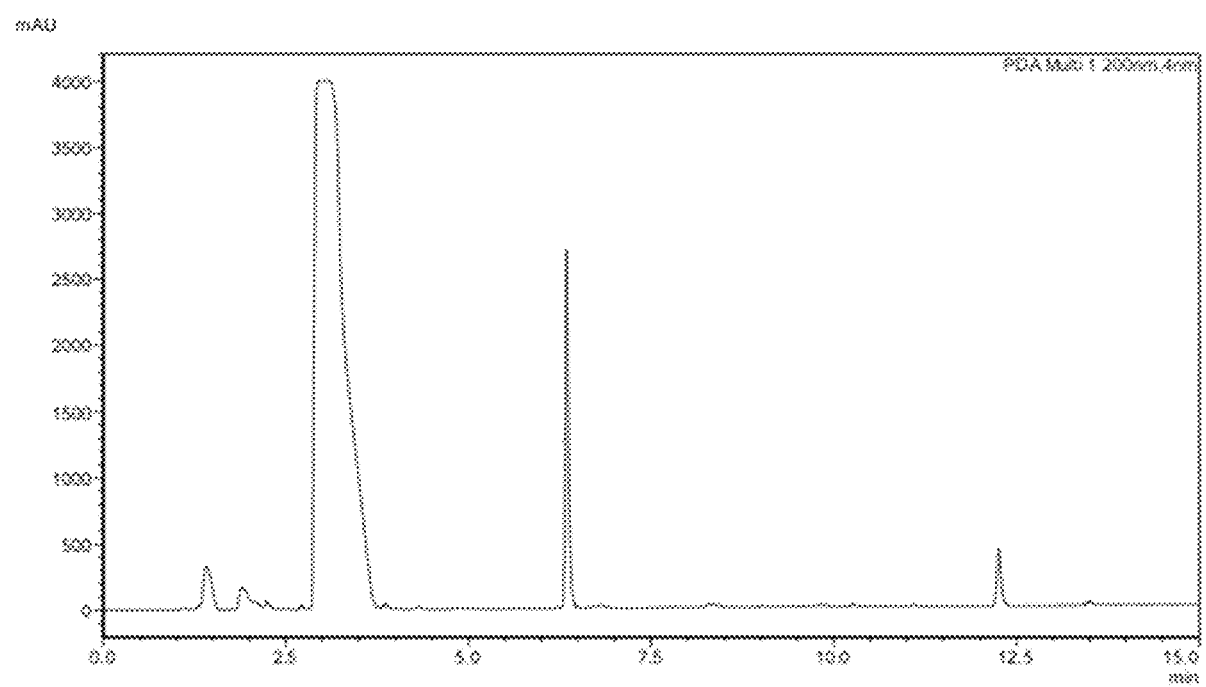
FIG. 2 is a graph showing the HPLC characterization of the final formulation of Example 2.

Polymers were characterized for MW and polydispersity using thick or THF mobile phase and HPLC. The results are shown in Table 1. Formulations were also characterized by HPLC. FIG. 1 shows the HPLC of the mother liquor synthesized in Example 2, and FIG. 2 shows the HPLC of the final formulation from Example 2.

TABLE 1

Molecular Weight and Polydispersity

| Material | Mobile Phase | MW | Dispersity |
|---|---|---|---|
| Mother Liquor 1 | Thick | 8021 | 1.92 |
| Mother Liquor 2 | Thick | 8034 | 1.94 |
| Mother Liquor 3 | THF | 7696 | 1.73 |
| Mother Liquor 4 | THF | 7699 | 1.93 |
| Mother Liquor 5 | THF | 7365 | 2.14 |
| Mother Liquor 6 | THF | 77051 | 1.66 |
| Mother Liquor 7 | THF | 1155 | 1.19 |
| Mother Liquor 8 | THF | 3241 | 1.94 |

Figure 3:
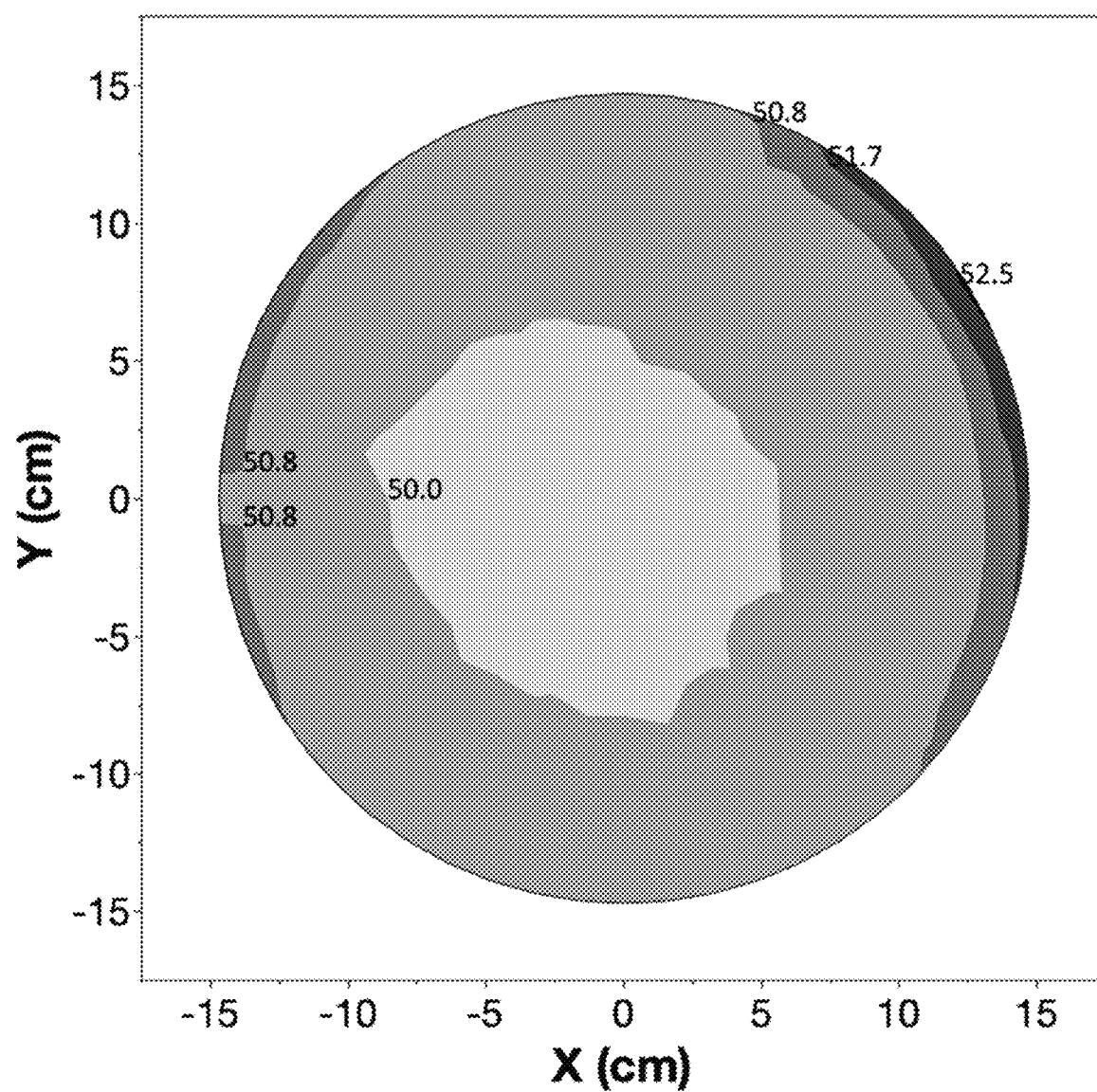
FIG. 3 is an image depicting the film thickness and uniformity of the material from Example 2.

Film thickness was measured using a M2000 ellipsometer. FIG. 3 shows the film thickness profile of the material formulated in Example 2.

Example 10

Lithography Results

Figure 4:
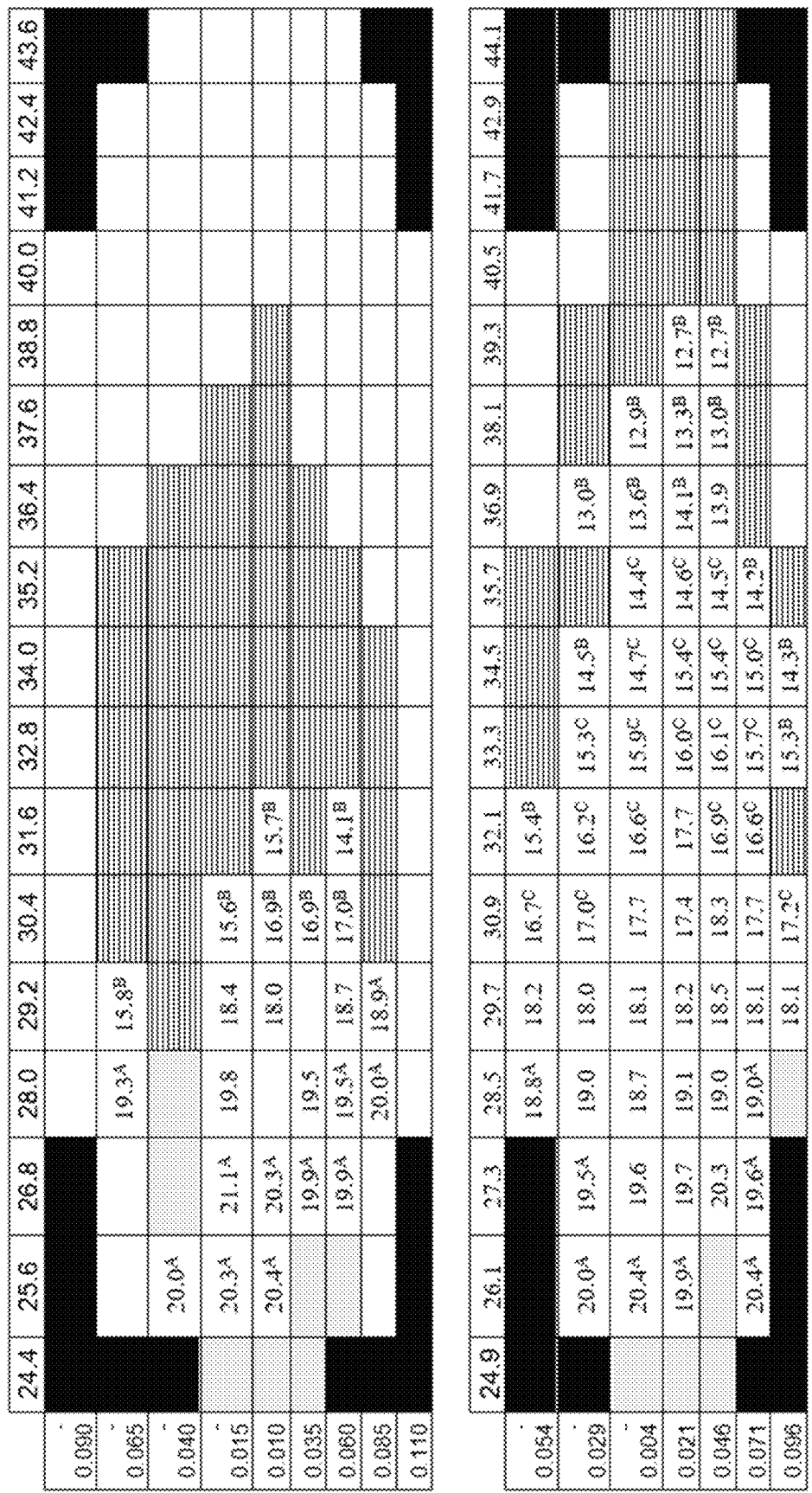
FIG. 4 is a chart showing the lithography results (Example 10) as a dose-focus matrix for the material from Example 5.

The material from Example 5 was spin coated onto a hardmask (an experimental, grafted silsesquioxane hardmask, Brewer Science, Rolla, MO) by spin coating at 1,241 rpm for 30 seconds and baking at 205° C. for 60 seconds to form a 5-nm film. A resist (JSR J3030, available from JSR Micro) was then coated by spin coating at 1,931 rpm for 26 seconds, and then baked at 130° C. for 60 seconds to form a 30-nm coat. The resist was then exposed using the parameters shown in Table 2. The resist and imaging process used is also shown in Table 2. A NXE3300 EUV scanner (available from ASML) was used for the imaging step, and a Pro Z track (available from Tokyo Electron Limited (TEL)) was used for the wafer process. FIG. 4 shows a comparison of the lithography quality using only a SOC and HM under the resist (top half of FIG. 4) versus the SOC and HM with the addition of the inventive adhesion layer beneath the resist (bottom half of FIG. 4). Use of the adhesion layer significantly widened the process window.

TABLE 2

Conditions Used for EUV Lithography.

| Parameter | Conditions |
|---|---|
| PEB (° C./sec): | 110/60 |
| Illumination mode: | Dipole45x |
| NA: | 0.33 |
| Sigma (outer/inner): | 0.902/0.671 |
| Dev. Time (s): | TMAH, 20 seconds |

FIG. 4 shows the dose-focus matrix for the material from Example 5. The x-axis (i.e., the top heading) shows dose (mJ/cm$^2$), and the y-axis (i.e., far-left column) shows focus ranges (μm). "Bridging" and "Collapse" are represented by Footnotes A and B, respectively, in a cell, while Footnote C in a cell represents those results that were within 10% of the target CD range. A cell with numbers but no footnotes represents a sample with no bridging or collapsing. In other words, the features and sizes were ideal. Cells with no numbers represent points where no testing was carried out. Cells with black backgrounds were outside of the testing matrix.

As shown by the results set forth in FIG. 4, the process window more than doubles when the inventive EUV underlayer is used as compared to an otherwise identical process that does not include the inventive EUV underlayer (see the cells with no footnotes).

Table 3 shows the dose-focus matrix for the material from Example 5. The x-axis (i.e., the top heading) shows dose (mJ/cm$^2$), and the y-axis (i.e., far-left column) shows focus ranges (μm). "Bridging" and "Collapse" are represented by Footnotes A and B, respectively, in a cell, while Footnote C in a cell represents those results that were within 10% of the target CD range. A cell with numbers but no footnotes represents a sample with no bridging or collapsing. In other words, the features and sizes were ideal. Cells with no numbers represent points where no testing was carried out. Cells with black backgrounds were outside of the testing matrix.

As shown by the results set forth in Table 3, the process window more than doubles when the inventive EUV underlayer is used as compared to an otherwise identical process that does not include the inventive EUV underlayer (see the cells with no footnotes).

Example 11

Underlayer Applied to Spin-on Carbon Layer

Figure 5:
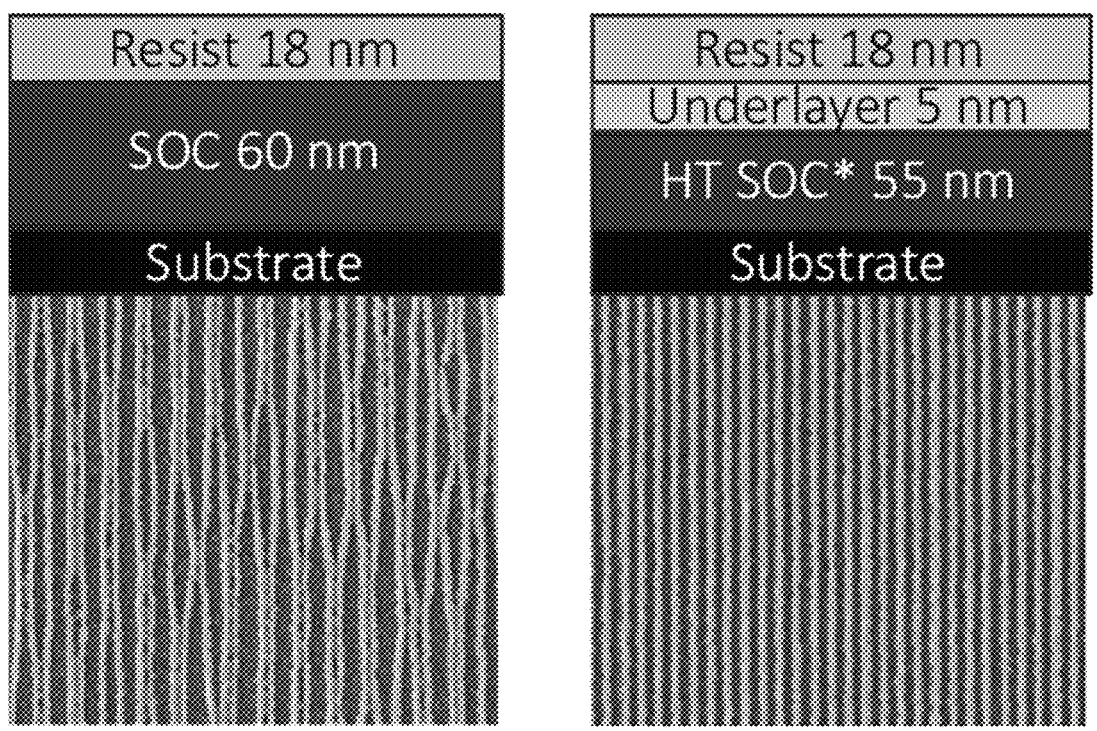
FIG. 5 is an image of the lithography stack and lithography results from Example 11.

A high-temperature spin-on carbon material was applied to two silicon wafers. The material from Example 5 was spin coated on the spin-on carbon material on one of the wafers. A metal-containing EUV photoresist from Inpria was coated onto both wafers and both wafers were patterned using EUV lithography. As shown in FIG. 5, the process using the underlayer from Example 5 (right image) did not show line bridging or collapse, while the process without the underlayer (left image) showed bridging and line collapse for a feature size of 12 nm.

We claim:

1. A method of forming a structure, said method comprising:
providing a substrate, said substrate including one or more intermediate layers thereon, said one or more intermediate layers comprising:

a spin-on carbon layer;
a hardmask layer comprising one or more of a silane, siloxane, silsesquioxane, silicon oxynitride, silicon nitride, polysilicon, or amorphous silicon; or
both said spin-on carbon layer and said hardmask layer on said spin-on carbon layer;
spin coating a composition on said spin-on carbon layer or on said hardmask layer to form an adhesion layer having an average thickness that is greater than a monolayer but less than 9 nm and a metal content of less than about 0.001% by weight, based upon the total weight of the adhesion layer taken as 100% by weight, wherein said composition comprises a component chosen from:
styrenes;
epoxies;
novolacs;
cyanurates;
polymers comprising recurring monomers selected from the group consisting of vinylic monomers, vinylic monomers grafted with a moiety, acrylic monomers, and combinations thereof;
or combinations of the forgoing, wherein:
said vinylic monomers are selected from the group consisting of glycidyl acrylate, glycidyl methacrylate, and combinations thereof;
said vinylic monomers grafted with a moiety are selected from the group consisting of chromophores with carboxylic acid moieties, alkyl carboxylic acids, aromatic carboxylic acids, ethers with carboxylic acid moieties, and combinations of the foregoing; and
said acrylic monomers are selected from the group consisting of 2-hydroxy-3-phenoxypropyl acrylate, hydroxy propyl methacrylate, 2-hydroxyethyl methacrylate, 2-hydroxyethyl acrylate, tert-butyl methacrylate, and combinations thereof;
forming a photoresist layer comprising a metal on said adhesion layer; and
subjecting at least a portion of said photoresist layer to EUV radiation.

2. The method of claim 1, wherein said substrate is selected from the group consisting of silicon, SiGe, SiO$_2$, Si$_3$N$_4$, SiON, SiCOH, aluminum, tungsten, tungsten silicide, gallium arsenide, germanium, tantalum, tantalum nitride, Ti$_3$N$_4$, hafnium, HfO$_2$, ruthenium, indium phosphide, coral, or glass.

3. The method of claim 1, wherein said adhesion layer has a metal content of about 0% by weight.

4. The method of claim 1, wherein said method further comprises baking said adhesion layer before forming said photoresist layer.

5. The method of claim 1, wherein said component is tris(2,3-epoxypropyl)isocyanurate.

6. The method of claim 1, wherein said subjecting said photoresist layer to EUV radiation is carried out with a dose of from about 5 mJ/cm$^2$ to about 100 mJ/cm$^2$.

7. The method of claim 1, further comprising forming a pattern in said photoresist layer after said subjecting said photoresist layer to EUV radiation.

8. The method of claim 7, further comprising transferring said pattern to said adhesion layer; to said one or more intermediate layers; and to said substrate.

9. The method of claim 8, wherein said forming a pattern in said photoresist layer comprises contacting said photoresist layer with a developer so as to remove some of said photoresist layer.

10. The method of claim 9, wherein said transferring said pattern comprises etching said adhesion layer; said one or more intermediate layers; and said substrate.

11. The method of claim 8, wherein said pattern has a resolution of less than about 40 nm half pitch.

12. The method of claim 1, wherein said one or more intermediate layers comprises said hardmask layer.

13. The method of claim 12, wherein said one or more intermediate layers comprises said spin-on carbon layer with said hardmask layer on said spin-on carbon layer.

14. The method of claim 1, wherein said one or more intermediate layers comprises said spin-on carbon layer.

15. The method of claim 1, wherein said metal is chosen from titanium, zinc, tin, hafnium, zirconium, indium, vanadium, cobalt, molybdenum, tungsten, aluminum, gallium, silicon, germanium, phosphorous, arsenic, yttrium, lanthanum, cerium, lutetium, or mixtures of the foregoing.

16. The method of claim 1, wherein said photoresist layer comprises an organometallic compound.

17. The method of claim 1, wherein said photoresist layer comprises a metal oxide.

18. A method of forming a structure, said method comprising:
providing a substrate, said substrate including one or more intermediate layers thereon, said one or more intermediate layers comprising:
a spin-on carbon layer;
a hardmask layer comprising one or more of a silane, siloxane, silsesquioxane, silicon oxynitride, silicon nitride, polysilicon, or amorphous silicon; or
both said spin-on carbon layer and said hardmask layer on said spin-on carbon layer;
spin coating a composition on said spin-on carbon layer or on said hardmask layer to form an adhesion layer, said adhesion layer being non-conductive and having an average thickness that is greater than a monolayer but less than 9 nm, wherein said composition comprises a component chosen from:
styrenes;
epoxies;
novolacs;
cyanurates;
polymers comprising recurring monomers selected from the group consisting of vinylic monomers, vinylic monomers grafted with a moiety, acrylic monomers, and combinations thereof;
or combinations of the forgoing, wherein:
said vinylic monomers are selected from the group consisting of glycidyl acrylate, glycidyl methacrylate, and combinations thereof;
said vinylic monomers grafted with a moiety are selected from the group consisting of chromophores with carboxylic acid moieties, alkyl carboxylic acids, aromatic carboxylic acids, ethers with carboxylic acid moieties, and combinations of the foregoing; and
said acrylic monomers are selected from the group consisting of 2-hydroxy-3-phenoxypropyl acrylate, hydroxy propyl methacrylate, 2-hydroxyethyl methacrylate, 2-hydroxyethyl acrylate, tert-butyl methacrylate, and combinations thereof;
forming a photoresist layer comprising a metal on said adhesion layer; and
subjecting at least a portion of said photoresist layer to EUV radiation.

19. The method of claim 18, wherein said substrate is selected from the group consisting of silicon, SiGe, SiO$_2$, Si$_3$N$_4$, SiON, SiCOH, aluminum, tungsten, tungsten silicide, gallium arsenide, germanium, tantalum, tantalum nitride, Ti$_3$N$_4$, hafnium, HfO$_2$, ruthenium, indium phosphide, coral, or glass.

20. The method of claim 18, wherein said method further comprises baking said adhesion layer before forming said photoresist layer.

21. The method of claim 18, wherein said component is tris(2,3-epoxypropyl)isocyanurate.

22. The method of claim 18, wherein said subjecting said photoresist layer to EUV radiation is carried out with a dose of from about 5 mJ/cm$^2$ to about 100 mJ/cm$^2$.

23. The method of claim 18, further comprising forming a pattern in said photoresist layer after said subjecting said photoresist layer to EUV radiation.

24. The method of claim 23, wherein said pattern has a resolution of less than about 40 nm half pitch.

25. The method of claim 18, wherein said one or more intermediate layers comprises said hardmask layer.

26. The method of claim 25, wherein said one or more intermediate layers further comprises said spin-on carbon layer, with said hardmask layer being on said spin-on carbon layer.

27. The method of claim 18, wherein said one or more intermediate layers comprises said spin-on carbon layer.

28. A method of forming a structure, said method comprising:
providing a substrate, said substrate including one or more intermediate layers thereon, said one or more intermediate layers comprising:
a spin-on carbon layer;
a hardmask layer comprising one or more of a silane, siloxane, silsesquioxane, silicon oxynitride, silicon nitride, polysilicon, or amorphous silicon; or
both said spin-on carbon layer and said hardmask layer on said spin-on carbon layer;
spin coating a composition on said spin-on carbon layer or on said hardmask layer to form an adhesion layer having an average thickness that is greater than a monolayer but less than 9 nm and a metal content of less than about 0.001% by weight, based upon the total weight of the adhesion layer taken as 100% by weight, said composition comprises a polymer selected from the group consisting of

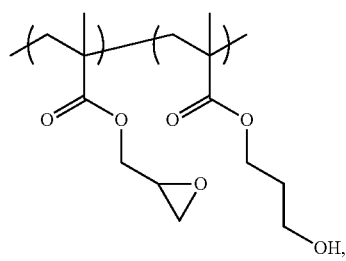

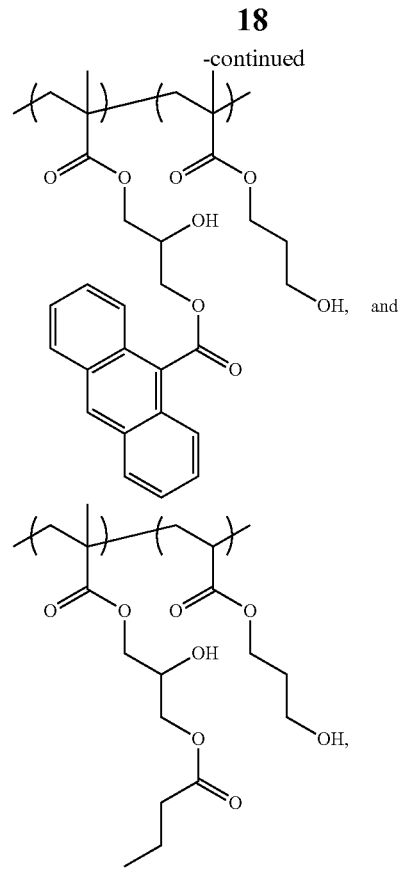

forming a photoresist layer comprising a metal on said adhesion layer; and
subjecting at least a portion of said photoresist layer to EUV radiation.

29. A method of forming a structure, said method comprising:
providing a substrate, said substrate including one or more intermediate layers thereon, said one or more intermediate layers comprising:
a spin-on carbon layer;
a hardmask layer comprising one or more of a silane, siloxane, silsesquioxane, silicon oxynitride, silicon nitride, polysilicon, or amorphous silicon; or
both said spin-on carbon layer and said hardmask layer on said spin-on carbon layer;
spin coating a composition on said spin-on carbon layer or on said hardmask layer to form an adhesion layer having an average thickness that is greater than a monolayer but less than 9 nm and a metal content of less than about 0.001% by weight, based upon the total weight of the adhesion layer taken as 100% by weight, said composition comprising:
a component chosen from acrylates, methacrylates, acrylic acids, styrenes, vinyls, epoxies, novolacs, cyanurates, or mixtures thereof; and
a compound having a moiety selected from the group consisting of chromophores with carboxylic acid moieties, alkyl carboxylic acids, aromatic carboxylic acids, ethers with carboxylic acid moieties, and combinations of the foregoing; and
forming a photoresist layer comprising a metal on said adhesion layer; and
subjecting at least a portion of said photoresist layer to EUV radiation.

* * * * *